United States Patent [19]
Bohr et al.

[11] Patent Number: 5,420,051
[45] Date of Patent: May 30, 1995

[54] PRE-POLY EMITTER IMPLANT

[75] Inventors: Mark T. Bohr, Aloha, Oreg.; Richard G. Taylor, New York, N.Y.; Stephen T. Chambers, Portland, Oreg.

[73] Assignee: Intel Corporation, Santa Clara, Calif.

[21] Appl. No.: 174,291

[22] Filed: Dec. 28, 1993

[51] Int. Cl.⁶ .................... H01L 21/265; H01L 21/44
[52] U.S. Cl. ...................................... 437/31; 437/186; 148/DIG. 10
[58] Field of Search ................................ 437/31, 186; 148/DIG. 9, DIG. 10, DIG. 11

[56] References Cited

U.S. PATENT DOCUMENTS

| | | |
|---|---|---|
| 3,553,830 | 1/1971 | Jenny et al. |
| 4,157,269 | 6/1979 | Ning et al. ............................ 437/33 |
| 4,531,282 | 7/1985 | Sakai et al. ........................... 437/31 |
| 5,116,770 | 5/1992 | Kameyama et al. ................... 437/31 |
| 5,147,809 | 9/1992 | Won et al. ............................. 437/31 |

OTHER PUBLICATIONS

S. Wolf, "Silicon Processing for the VLSI Era vol. 2—Process Integration, Chapter 7—Bipolar and Bicmos Process Integration," pp. 453–561, 1990.

Primary Examiner—Olik Chaudhuri
Assistant Examiner—Brian K. Dutton
Attorney, Agent, or Firm—Blakely, Sokoloff, Taylor & Zafman

[57] ABSTRACT

A process of forming an emitter of a bipolar transistor is described. Dopants of a first conductivity type is implanted in the substrate to form the base. Dopants of a second conductivity type is then implanted into the base region to form a substrate emitter region. A polysilicon layer is then deposited over the substrate emitter and doped to form the doped polysilicon layer. An outdiffusion step follows to link the doped polysilicon layer to the substrate emitter.

20 Claims, 6 Drawing Sheets

PRE-POLY EMITTER IMPLANT

BACKGROUND OF THE INVENTION

1. Field of the Invention

The present invention relates to the field of bipolar junction processing and in particular, to the formation of an emitter region for a bipolar junction transistor.

2. Related Art

One prior processing technique for forming the emitter involves implanting dopants into a monocrystalline substrate followed by the formation of a metal contact with the emitter. With this technique though, the implanted dopants are the only source of emitter dopants and consequently, the dosage required to form a suitable emitter is quite high. The high dosage in turn causes large amounts of implant damage and associated defects in the substrate because of the high number of atoms being forced into the substrate. In addition, the emitter region is formed exclusively in the substrate. Thus, to obtain the required emitter depth for a suitable emitter, a deep implant into the substrate is required. However, the deep implant results in a loss of emitter depth control and loss of base width control.

A second prior processing technique for forming the emitter involves implanting or diffusing (phosphorus predeposition in a 950° C. furnace or arsenic spin-on followed by furnace exposure) dopants into a polysilicon layer lying in direct contact with the monocrystalline substrate. The doped polysilicon emitter becomes a part of the transistor when the polysilicon emitter is electrically linked to the base by applying a diffusion step to cause outdiffusion of the dopants into the substrate. The outdiffusion of dopants into the substrate also results in a thin emitter region in the substrate. Thus, the emitter region comprises of a doped polysilicon emitter and a doped substrate region. An emitter formed in this manner affords greater control of the base width and emitter depth. This control allows the formation of a more narrow base region in the transistor leading to greater current gain than that of transistors with conventional emitters. However, with the performance requirements of current devices, even greater control is necessary.

Transistors formed with this process also exhibited susceptibility to many factors that reduce transistor performance and reliability. Oxide at the polysilicon-substrate interface impede dopant diffusion during the outdiffusion step causing emitter depths and base widths to vary. In addition, thickness variations of the polysilicon layer affects the emitter depths and base widths because a given diffusion length results in different emitter depths depending on the amount of polysilicon the dopants have to travel through. Moreover, grain structure variations of the polysilicon layer affect the emitter depths and base widths by altering the diffusion characteristics of the dopants during the initial diffusion into the polysilicon and the subsequent outdiffusion into the substrate. Finally, temperature variations of the diffusion process greatly affect the emitter depths and base widths because they impact the diffusion profiles during the initial diffusion of dopants into the polysilicon and subsequent outdiffusion into the substrate.

Thus, what is needed is a manufacturable method for forming a reliable, uniform emitter which is not affected by oxide at the polysilicon-substrate interface, thickness variations of the polysilicon layer, grain structure variations of the polysilicon layer, and temperature variations of the outdiffusion process. In addition, a method providing greater emitter depth control and emitter dose control is also needed.

SUMMARY OF THE INVENTION

A novel process for forming an emitter of a bipolar transistor is described. A base region is formed by introducing ions of a first conductivity type into a semiconductor material. A first emitter region is then formed by introducing ions of a second conductivity type through implantation or diffusion into the base. The ions of a second conductivity type can be introduced into the semiconductor material through the oxide layer or through an opening in the oxide layer. After the first emitter region is formed in the semiconductor material, a layer of polysilicon is applied over the first emitter region. Ions of a second conductivity type are introduced into the polysilicon layer by implantation or diffusion. An outdiffusion step follows to drive the ions in the polysilicon layer into the semiconductor material. It is possible to vary the dopant concentration profile across the two emitter regions. Use of phosphorus for the first emitter region results in a more gradual concentration change compared to the use of arsenic. As a consequence of the more gradual concentration change, a higher breakdown voltage is obtained at the emitter/base junction.

BRIEF DESCRIPTION OF THE DRAWINGS

FIG. 1 a is an illustration of a cross sectional view showing a portion of a lightly doped p-type substrate.

DETAILED DESCRIPTION OF THE PRESENT INVENTION

A novel process for forming a bipolar transistor is described. More particularly, the invention is directed to an emitter region of a bipolar transistor. In the following description, numerous specific details are set forth, such as specific conductivity types, doping levels, and process steps etc. in order to provide a thorough understanding of the present invention. It will, however, be obvious to one skilled in the art that the present invention may be practiced without these details. In other instances, well-known semiconductor processing steps such as cleaning steps, and lithography etc. have not been described in particular detail in order not to obscure the present invention.

The following description describes the formation of an exemplary non transistor in an p-well or p-type substrate. It will be obvious to one skilled in the art that the present invention may be used where a pnp transistor is fabricated using the present invention in a n-type well or substrate region. The dopant conductivity would be simply opposite to that disclosed in the specification. The following description also describes the formation of an exemplary transistor where the collector and base are formed in the substrate. It will be obvious to one skilled in the art that the present invention may be used where the collector or base or both are formed in an epitaxial layer. From here on forward, substrate is meant to include the substrate and any epitaxial layers if any. In addition, the following description describes the formation of a single transistor. It will be obvious to one skilled in the art that the present invention may be used where multiple transistors are fabricated simultaneously.

Figure 1A:
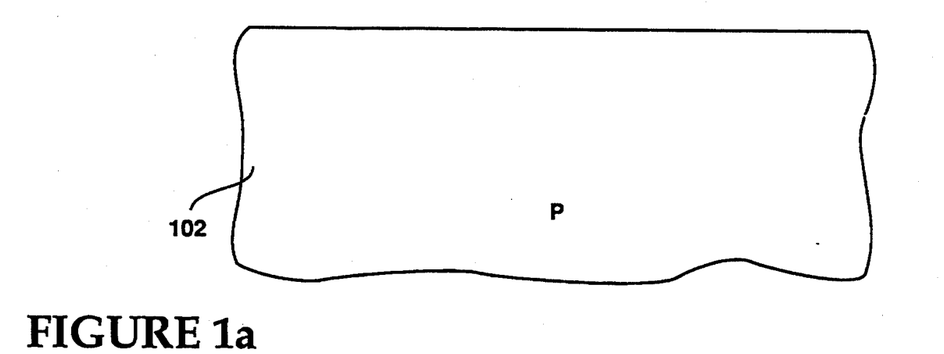

FIG. 1a illustrates the starting material used in an embodiment of the present invention to form a npn bipolar transistor. The starting material consists of a lightly doped silicon substrate 102 with a p conductivity type and a dopant concentration of $1.0 \times 10^{14}$–$5.0 \times 10^{15}$ cm$^{-3}$. In this embodiment, p-type substrate 102 has a $<100>$ crystalline orientation.

Figure 1B:
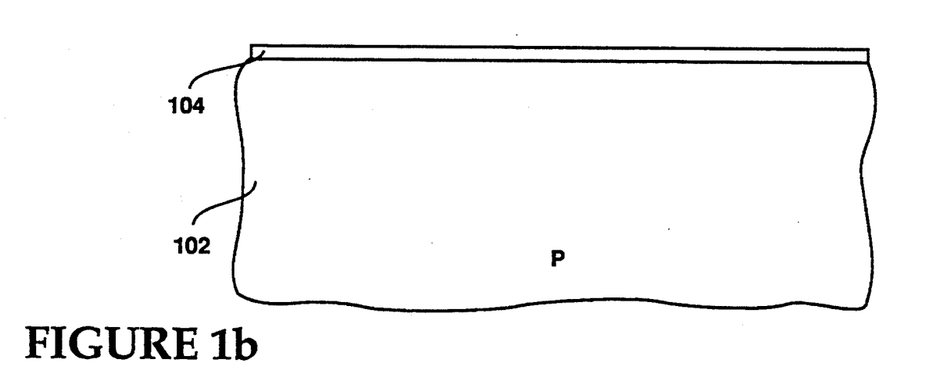
FIG. 1b illustrates the substrate of FIG. 1a after an oxide layer is grown on the surface of the substrate.

To begin with, SiO$_2$ oxide layer 104 is grown on the surface of substrate 102 as illustrated in FIG. 1b. Oxide layer 104 is formed by exposing substrate 102 to oxygen at high temperatures and is grown to an approximate thickness of between 100 to 2000 Å. Oxide layer 104 can also be formed by deposition using well known techniques. Oxide layer 104 acts as an isolation layer and also covers substrate 102 to keep it clean.

Figure 1C:
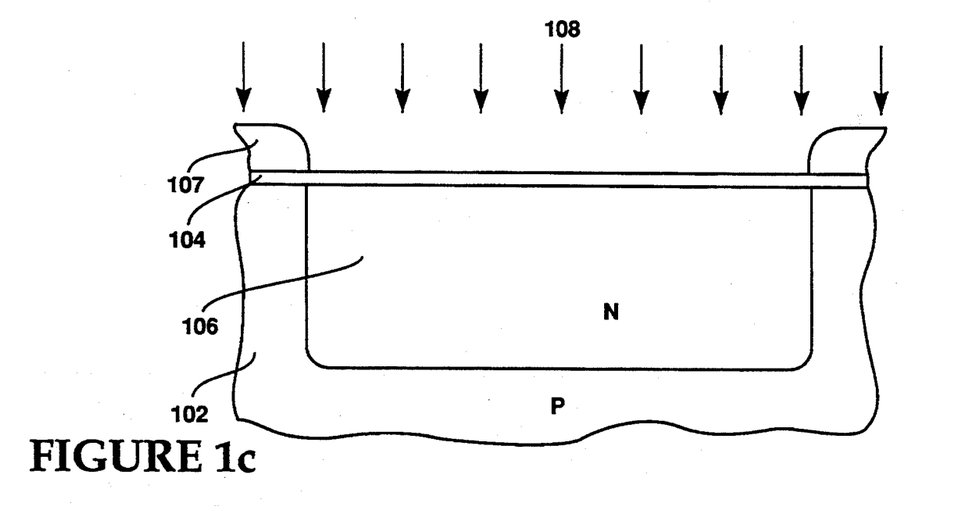
FIG. 1c illustrates the substrate of FIG. 1b after a masking step and during an ion implantation step.

Next, collector 106 of the bipolar transistor is formed as illustrated in FIG. 1c. In this step, photoresist is applied and patterned forming photoresist mask 107. Phosphorus ions 108 are implanted into substrate 102 using photoresist mask 107. The implant energy level is 20–200 keV with a dose of between $1.0 \times 10^{13}$–$1.0 \times 10^{14}$ cm$^{-2}$. A drive-in diffusion process (1000°–1100° C. in a furnace for 1–10 hours) is next used to push the dopants in substrate 102 further into substrate 102. A n-well with a depth of one to five microns results forming n conductivity type collector region 106 with a dopant concentration near the surface of $3.0 \times 10^{16}$–$3.0 \times 10^{17}$ cm$^{-3}$.

Figure 1D:
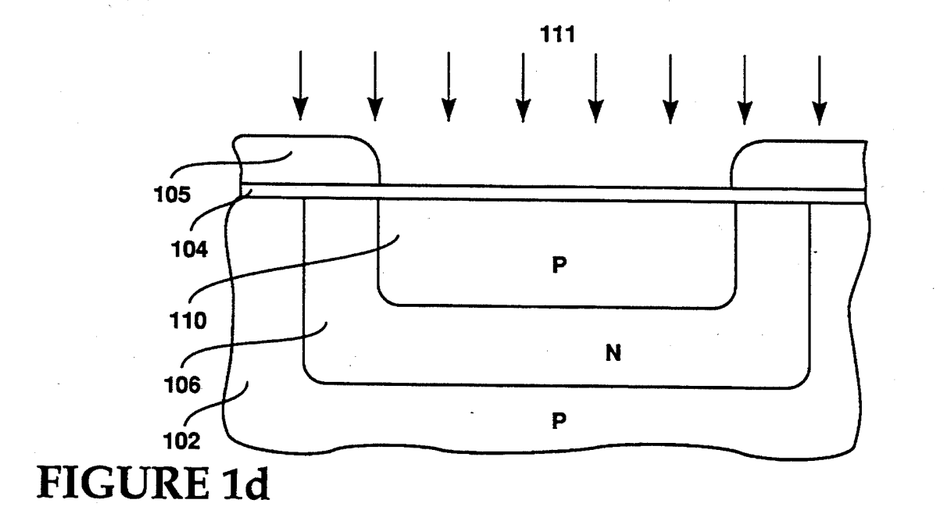
FIG. 1d illustrates the substrate of FIG. 1c after an additional masking step and during an additional ion implantation step.

Next, as shown in FIG. 1d, base 110 for the bipolar transistor is formed. In this step, photoresist 107 is removed and a new photoresist is applied and patterned to form photoresist mask 105. P-type dopants 111 enter the n type collector region as a result of ion implantation through oxide layer 104 using photoresist mask 105. Boron (B) or boron compounds such as boron fluoride (BF) is used as the dopant with an ion energy of 10–50 keV and dosage of between $1.0 \times 10^{13}$–$1.0 \times 10^{14}$ cm$^{-2}$. The base implantation results in a concentration near the surface of $1.0 \times 10^{18}$–$5.0 \times 10^{18}$ cm$^{-3}$. The region where the p-type dopants 111 eventually reside forms p conductivity type base 110 of the bipolar transistor. Under this embodiment, base 110 is formed with a shallow depth of $0.20 \pm 0.05$ μm.

Figure 1E:
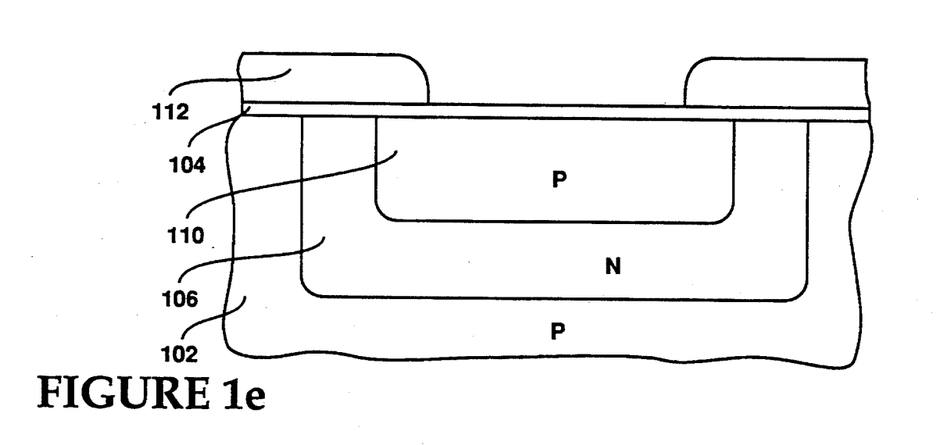
FIG. 1e illustrates the substrate of FIG. 1d after a third masking step.

Next, photoresist mask 112 is formed as illustrated in FIG. 1e. In this step, photoresist is applied over SiO$_2$ oxide layer 104 and patterned with well known techniques to form mask 112.

Figure 1F:
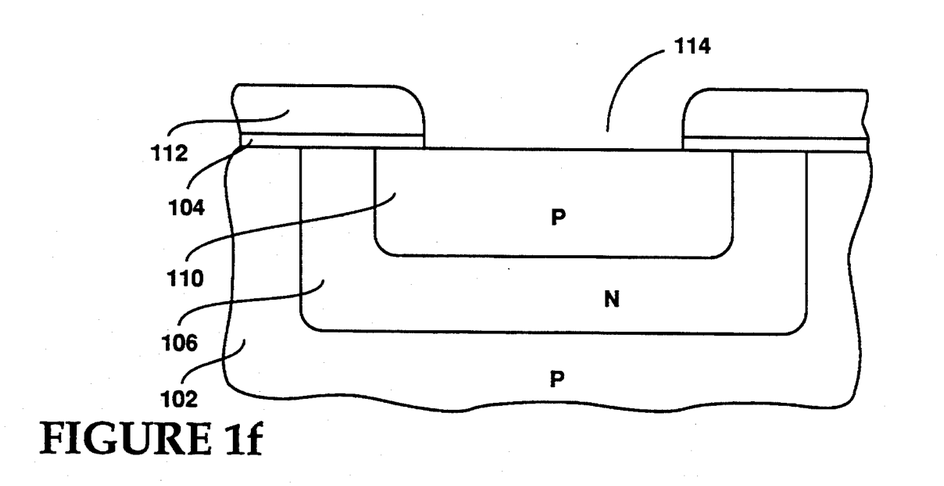
FIG. 1f illustrates the substrate of FIG. 1e after an etch step.

Next, emitter cut 114 is formed as shown in FIG. 1f. In this step, the part of oxide layer 104 not covered by patterned photoresist is etched away with well known techniques such as plasma etch, buffered hydrogen fluoride (HF) chemical wet etch, and other chemical wet etches. The result is emitter cut 114 forming a window over the region where the emitter is to be formed.

Figure 1G:
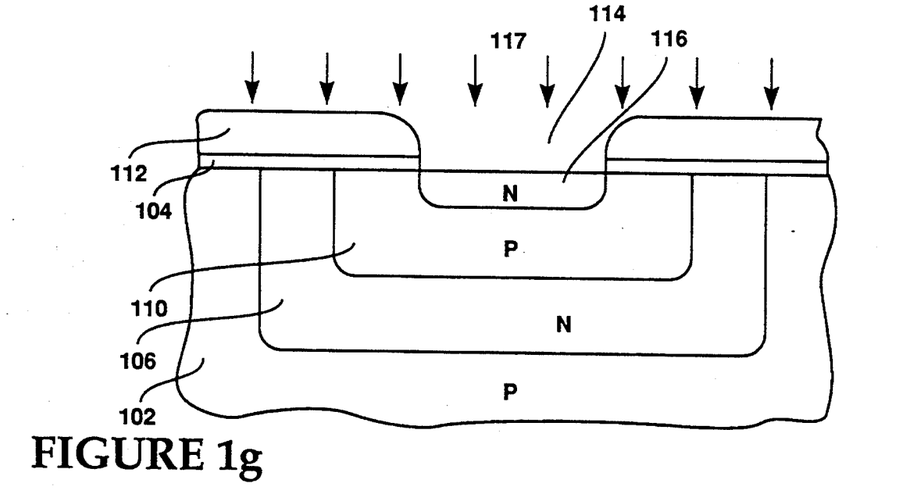
FIG. 1g illustrates the substrate of FIG. 1f during an ion implantation step.

The first step of forming the emitter is to form substrate emitter 116 as illustrated in FIG. 1g. In this step, dopants of n conductivity type 117 such as arsenic or phosphorus are implanted through emitter cut 114. If desired, n-type dopants 117 can alternatively be diffused through emitter cut 114 with well known techniques. Arsenic is desired for shallow substrate emitter implants because its diffusion characteristics ensures that the subsequent exposure to high temperatures does not cause the substrate emitter depth to diffuse further and extend beyond the desired depth. Phosphorus is desired for a graded emitter with a gradual concentration change because it diffuses more rapidly providing an extended low dose region. When phosphorus is used, it is implanted at zero or seven degrees from normal with an ion energy of 10–20 keV and a dose of between $1.0 \times 10^{13}$–$1.0 \times 10^{14}$ cm$^{-2}$. A seven degree orientation is used to avoid implant channeling. Otherwise, a zero degree orientation is used. The region where the n-type dopants reside in the substrate forms substrate emitter 116. All other regions of substrate 102 are prevented from receiving the dopants by remaining SiO$_2$ oxide layer 104 and patterned photoresist layer 112. The result of this implantation is substrate emitter region 116 with a depth of $0.12 \pm 0.03$ μm and a dopant concentration of $2.0 \times 10^{18}$–$2.0 \times 10^{19}$ cm$^{-3}$ near the surface. On the other hand, when arsenic is used, it is implanted at zero degree (or seven degrees to avoid implant channeling) from normal with an ion energy of 20–30 keV and a dose of between $1.0 \times 10^{13}$–$1.0 \times 10^{14}$ cm$^{-2}$. The region 116 where n-type dopants reside in substrate 102 forms substrate emitter 116. All other regions of substrate 102 are prevented from receiving the dopants by remaining SiO$_2$ oxide layer 104 and photoresist mask 112. The result of this implantation is a substrate emitter region 116 with a depth of $0.10 \pm 0.03$ μm and a dopant concentration of $1.0 \times 10^{19}$–$1.0 \times 10^{20}$ cm$^{-3}$ near the surface. Substrate emitter 116 can also be formed by well known diffusion techniques whereby arsenic or phosphorus is diffused through emitter cut 114.

It is to be appreciated that substrate emitter 116 is formed before the formation of the polysilicon layer. Consequently, many of the factors behind decreased transistor performance and reliability under the prior processing technique are mitigated. In the prior processing technique, oxide at the polysilicon-substrate interface impeded dopant diffusion during the outdiffusion step causing the emitter depth and base width to vary. In addition, thickness variations of the polysilicon layer affected the emitter depth and base width because a given diffusion length resulted in a different emitter depth depending on the amount of polysilicon the dopants had to travel through. Moreover, grain structure variations of the polysilicon layer affected the emitter depth and base width by altering the diffusion characteristics of the dopants during the initial diffusion into the polysilicon and the subsequent outdiffusion into the substrate. Finally, temperature variations of the diffusion process greatly affected the emitter depth and base width because they impacted the diffusion profiles during the initial diffusion of dopants into the polysilicon and subsequent outdiffusion into the substrate.

In the present process however, substrate emitter 116 is formed before the polysilicon is formed. Thus, the substrate emitter depth and the base width are determined before polysilicon formation. Consequently, oxide at the polysilicon-substrate interface which forms during polysilicon formation, thickness variations of the polysilicon, grain structure variations of the polysilicon, and temperature variations of the outdiffusion process do not affect substrate emitter depth and base width because the substrate emitter depth and base width are already determined. In addition, forming substrate emitter 116 before the formation of the polysilicon layer also results in greater substrate emitter depth control and greater dose control than that possible under the prior technique.

Both depth control and dose control are dependent on the process used and the distance dopants have to travel. Implantation process affords greater depth control and dose control than the diffusion process. Shorter travel distances also affords greater depth control and dose control than longer travel distances. In the prior processing technique, a diffusion process was used to introduce dopants into the substrate from the polysilicon emitter. In this embodiment of the present invention however, implantation is used to introduce dopants into the substrate. Thus, this process affords greater depth and dose control. Use of implantation to introduce dopants into the substrate in the prior technique would not have afforded the level of depth control and dose control of the present process. This occurs because implantation under the prior technique would have required the implantation of dopants at a much higher energy to penetrate the polysilicon layer. This longer distance would have resulted in a loss of depth control and dose control. Consequently, the current process of forming substrate emitter 116 by implantation results in greater depth control and dose control than either diffusion under the prior technique or implantation under the prior technique.

The first prior processing technique of implanting dopants into the substrate to form the emitter would have avoided the problems of oxide at the polysilicon interface, polysilicon thickness variation, polysilicon grain structure variation and outdiffusion temperature variation. The problems associated with the polysilicon emitter process do not exist under the first prior processing technique because polysilicon is not used. However, under the first prior technique, a high dose of dopants ($1.0 \times 10^{15}$–$1.0 \times 10^{16}$ cm$^{-2}$) is required to implant the emitter region with sufficient dopants to provide low resistance. The high dose results in large amounts of implant damage and the corresponding defects associated with the implant damage. In addition, under the first prior technique, the emitter is formed exclusively in the substrate. The emitter has to have a large depth to sustain the required dosage and also to provide sufficient separation between the base and metal contact. The separation is required to minimize minority carrier recombination caused by the metal and to minimize spiking effects caused by metal reacting with the substrate. The large emitter depth in turn requires a deep implant to achieve the large depth. The deep implant results in a loss of emitter depth control and therefore, a loss of base width control because a deep implant requires long implant distances which results in loss of control.

In the present process however, the substrate emitter region receives dopants from the pre-poly implantation and the subsequent polysilicon outdiffusion process. Because the substrate emitter region receives dopants from two sources, the dose required during implantation to achieve a specified dopant concentration is lower. The lower dose during implantation results in less implant damage and associated defects in the substrate. In addition, in the present process, the substrate emitter region can be more narrow because the polysilicon layer also acts as part of the emitter. The polysilicon layer provides the necessary separation from the metal contact allowing for a more narrow substrate emitter region. The more narrow substrate emitter region results in a smaller implant distance during the implantation process. The smaller implant distance in turn allows for greater emitter depth control and greater base width control.

Figure 1H:
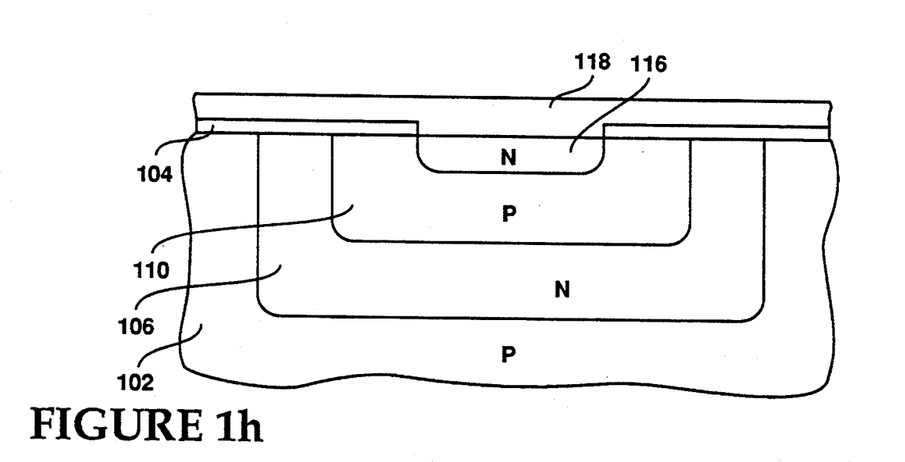
FIG. 1h illustrates the substrate of FIG. 1g after a polysilicon layer is deposited.

After the formation of substrate emitter 116, polysilicon layer 118 is formed as illustrated in FIG. 1h. Polysilicon layer 118 can be formed by well known techniques such as chemical vapor deposition (CVD) to a thickness of between 2000 Å to 5000 Å over the entire surface of substrate 102.

Figure 1I:
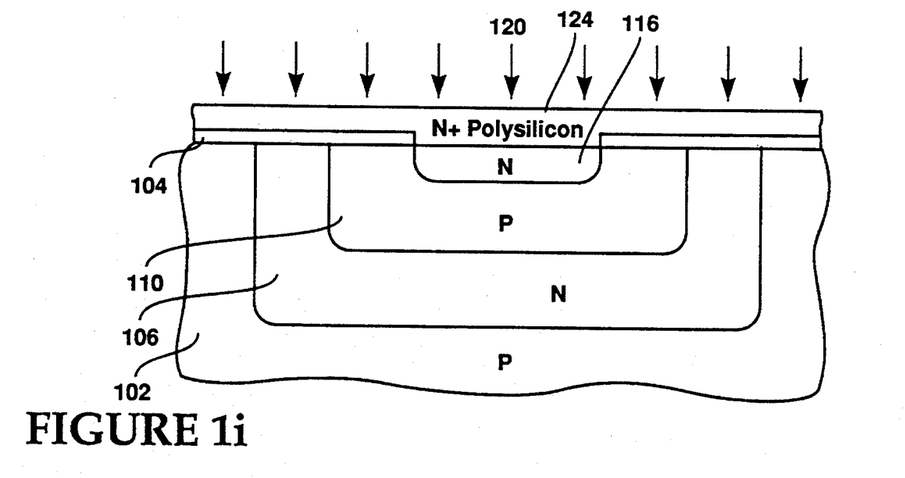
FIG. 1i illustrates the substrate of FIG. 1h during ion implantation of the polysilicon layer.

Next, as shown in FIG. 1i, n-type dopants 120 are introduced into polysilicon layer 118 forming doped polysilicon layer 124. In this step, dopants of n conductivity type 120 are implanted or diffused into polysilicon layer 118. Arsenic is the preferred dopant although phosphorus can also be used. An implant process is preferred because it allows a high degree of dose control. Under the implant method, dopants are implanted with an ion energy of 70–130 keV and dose of between $1.0 \times 10^{15}$–$1.0 \times 10^{16}$ cm$^{-2}$. After implantation, an anneal step is performed at a temperature of 850°–950° C. for 10–30 minutes. The resulting doped polysilicon layer 124 has a concentration near the surface of $1.0 \times 10^{19}$–$5.0 \times 10^{20}$ cm$^{-3}$. On the other hand, the diffusion method is chosen if lower process costs are desired. Under the diffusion process, dopants are diffused into the polysilicon at a temperature of 900°–950° C. for 10–30 minutes. No annealing is performed under the diffusion process.

Figure 1J:
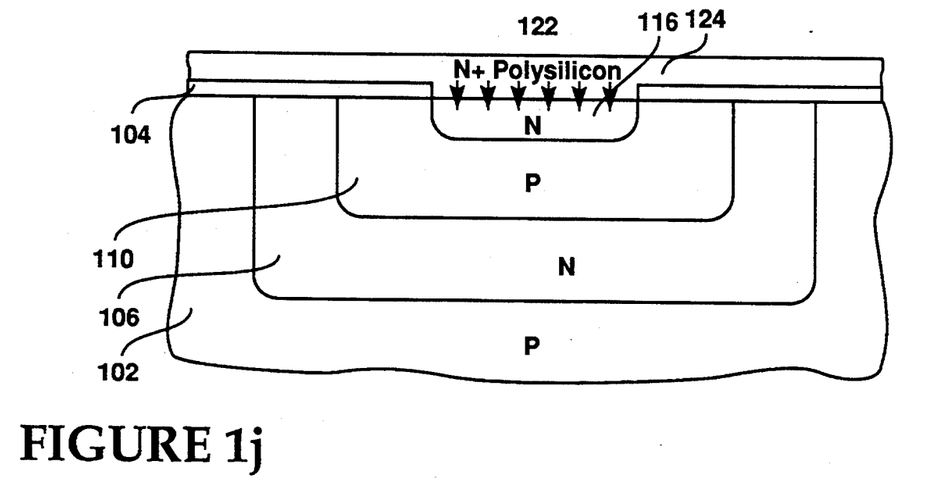
FIG. 1j illustrates the substrate of FIG. 1i during an outdiffusion step.

As illustrated in FIG. 1j, the anneal step causes outdiffusion of n conductivity type dopants 122 from the polysilicon layer into the n-type substrate emitter region. The outdiffusion electrically links up doped polysilicon layer 124 with the n-type substrate emitter 116. When the subsequent outdiffusion of dopants 122 occurs, two regions are formed, a first low dose emitter region in contact with the collector and a second higher dose emitter region in contact with the polysilicon layer. The first low dose emitter region has a concentration level comprising of the implanted dopants alone. The second higher dose emitter region has a concentration level comprising of the implanted dopants and the outdiffused dopants. When phosphorus is chosen as the implant to form substrate emitter 116 in the earlier step, the outdiffusion process in this step results in a graded substrate emitter with a gradual concentration change. The graded substrate emitter results because phosphorus diffuses rapidly providing an extended low dose region.

A graded substrate emitter structure allows the formation of a bipolar transistor with a greater emittedbase junction breakdown voltage. The greater breakdown voltage leads to an improved transistor that has the ability to operate over a greater range of operating voltages. Under the prior technique, a graded substrate emitter could be achieved by diffusing both arsenic and phosphorus from the polysilicon emitter. However, the current process offers better control of the junction depth as well as more control of the dopant concentration gradients in the two regions of the emitter.

Figure 1K:
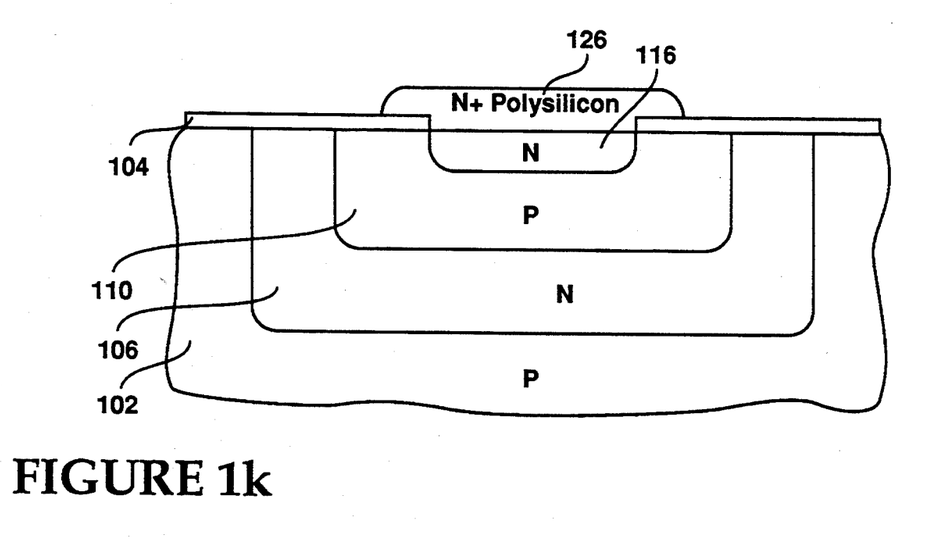
FIG. 1k illustrates the substrate of FIG. 1j after the polysilicon layer is patterned and etchted.

Finally, doped polysilicon layer 124 is patterned and etched to form patterned polysilicon layer 126 as shown in FIG. 1k.

Figure 2A:
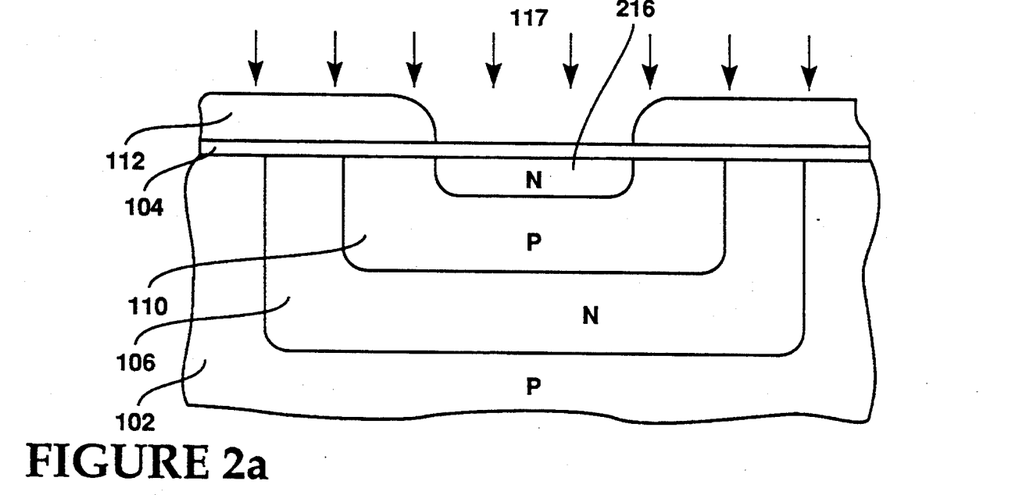
FIG. 2a illustrates the substrate of FIG. 1e during an ion implantation step.

In a second embodiment, substrate 102 is first processed as described and illustrated with respect to FIG. 1a-FIG. 1e. Next, as shown in FIG. 2a, substrate emitter 216 is formed by the introduction of n conductivity type dopants 117 through oxide layer 104 into substrate 102. Oxide layer 104 is left intact until after substrate emitter 216 is formed. Substrate emitter 216 is formed with implantation of phosphorus for graded substrate emitters with a gradual concentration change. The phosphorus is implanted at zero degree (or seven degrees to avoid implant channeling) from normal with an ion energy of 40–80 keV and a dose of between $1.0 \times 10^{13}$–$1.0 \times 10^{14}$ cm$^{-2}$. The region where the n-type dopants reside in the substrate forms substrate emitter 216. All other regions of substrate 102 are prevented from receiving the dopants by photoresist mask 112. The result of this implantation is a substrate emitter region with a depth of $0.12 \pm 0.03$ μm and a dopant concentration of $2.0 \times 10^{18}$–$1.0 \times 10^{19}$ cm$^{-3}$ near the surface. For a shallow substrate emitter, arsenic is used. Arsenic is implanted at zero degree (or seven degrees to avoid implant channeling) from normal with an ion energy of 60–120 keV and a dose of between $1.0 \times 10^{13}$–$1.0 \times 10^{14}$ cm$^{-2}$. The region where the n-type dopants reside in the substrate forms substrate emitter 216. All other regions of substrate 102 are prevented from receiving the dopants by photoresist mask 112. The result of this implantation is a substrate emitter region with a depth of $0.10 \pm 0.03$ μm and a dopant concentration of $1.0 \times 10^{19}$–$1.0 \times 10^{20}$ cm$^{-3}$ near the surface.

The second embodiment is generally preferred because it compensates for screen oxide thickness variations. Base region 110 of the transistor is formed by ion implantation of p-type dopants through the screen oxide 104. Screen oxide thickness variations on a wafer will result in variations in the base depth among different transistors because greater screen oxide thickness will reduce the penetration of dopants into the substrate. Under the second embodiment, screen oxide 104 is removed over the emitter region after the emitter is formed. In the first embodiment, when the first emitter region is formed by ion implantation of n-type dopants, screen oxide variations no longer affect the penetration depth of dopants because the screen oxide layer no longer exists over the emitter region. The penetration depth of n-type dopants becomes fairly uniform and the emitter depth corresponding exhibits similar uniformity. However, the screen oxide thickness variation still impacts the base depth. The variation in the base depth coupled with the relative lack of variation in the emitter depth results in a large variation in the base width. The base width variation occurs because the base width is the difference of the base depth and the emitter depth. This variation reduces transistor performance. Additionally, an excessively large base width reduces current gain and an excessively narrow base width causes leakage.

The second embodiment addresses the problem of screen oxide thickness variation. In the second embodiment, screen oxide 104 is left on after the base implant. The emitter implant is then performed through the same screen oxide 104. Because screen oxide 104 remains in place during the emitter implantation, the emitter dopants face the same oxide barrier as the base dopants. Although the screen oxide thickness varies along the surface of the wafer, in this embodiment, the variation affects the base depth and the emitter depth equally. The difference between the base depth and emitter depth remains relatively uniform across the substrate resulting in an uniform base width among the different transistors across the wafer.

Figure 2B:
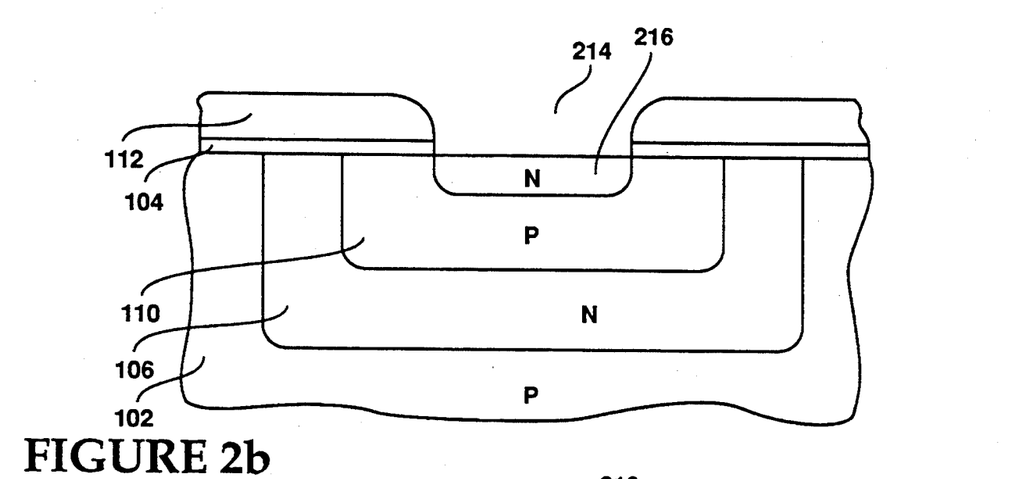
FIG. 2b illustrates the substrate of FIG. 2a after an etch step.

After the formation of substrate emitter 216, emitter cut 214 is formed as illustrated in FIG. 2b. In this step, exposed layer 104 is etched away by well known techniques such as plasma etch, buffered HF chemical wet etch and other chemical wet etches. Photoresist mask 112 is then removed. The result is an emitter cut forming a window over those regions where substrate emitter 216 was formed.

Figure 2C:
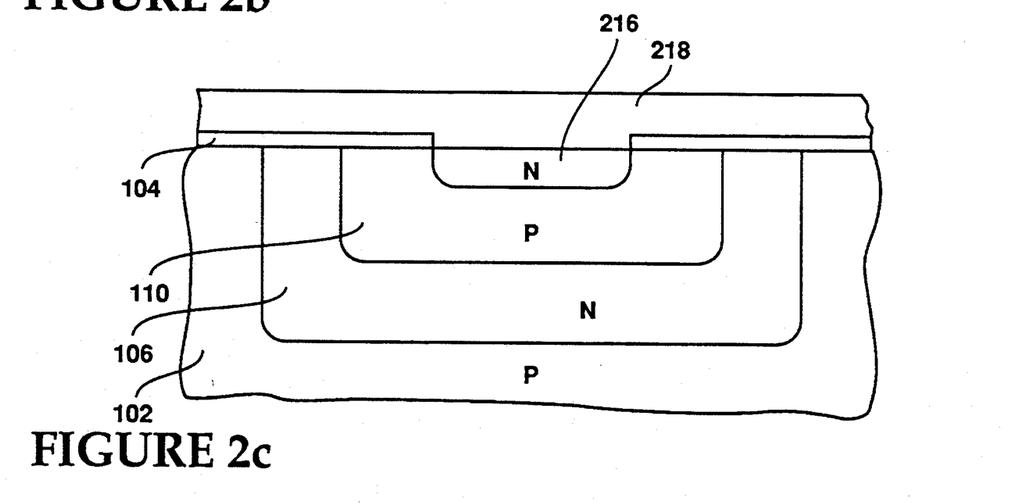
FIG. 2c illustrates the substrate of FIG. 2b after a polysilicon layer is deposited.

Next, as shown in FIG. 2c, polysilicon layer 218 is formed. In this step, polysilicon layer 218 can be formed by well known techniques such as CVD to a thickness of between 2000 Å to 5000 Å over the entire surface of substrate 102.

Figure 2D:
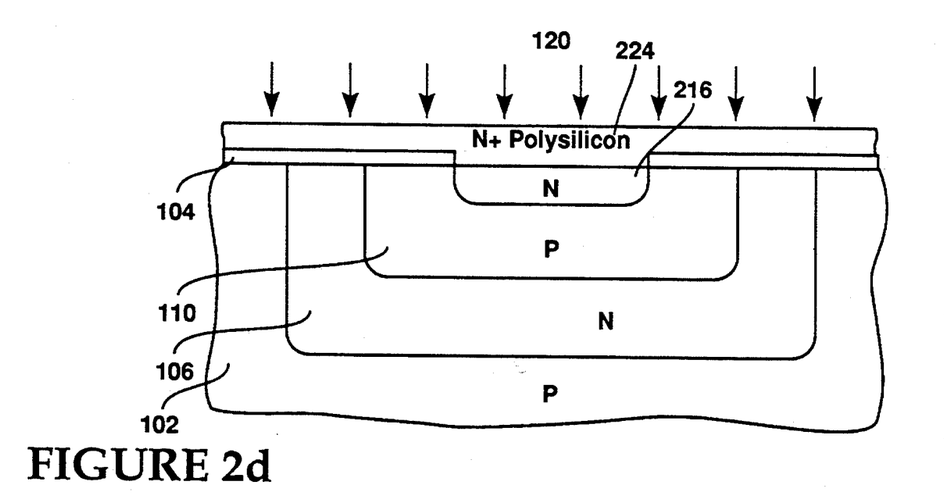
FIG. 2d illustrates the substrate of FIG. 2c during ion implantation of the polysilicon layer.

Next, as illustrated in FIG. 2d, n-type dopants 120 is introduced into polysilicon layer 218 forming doped polysilicon layer 224. In this step, dopants of n conductivity type 120 are implanted or diffused into the polysilicon layer by well-known techniques. Arsenic is preferred as a dopant although phosphorus can also be used. An implant process in this step is preferred because it allows a high degree of dose control. Under the implant method, dopants are implanted at with an ion energy of 70–130 keV and dose of between $1.0 \times 10^{15}$–$1.0 \times 10^{16}$ cm$^{-2}$. After implantation, an anneal step is performed at a temperature of 850°–950° C. for 10–30 minutes. The resulting doped polysilicon layer 224 has a concentration near the surface of $1.0 \times 10^{19}$–$5.0 \times 10^{20}$ cm$^{-3}$. On the other hand, the diffusion method is chosen if lower process costs are desired. Under the diffusion process, dopants are diffused into the polysilicon at a temperature of 900°–950° C. for 10–30 minutes. No annealing is performed under the diffusion process.

Figure 2E:
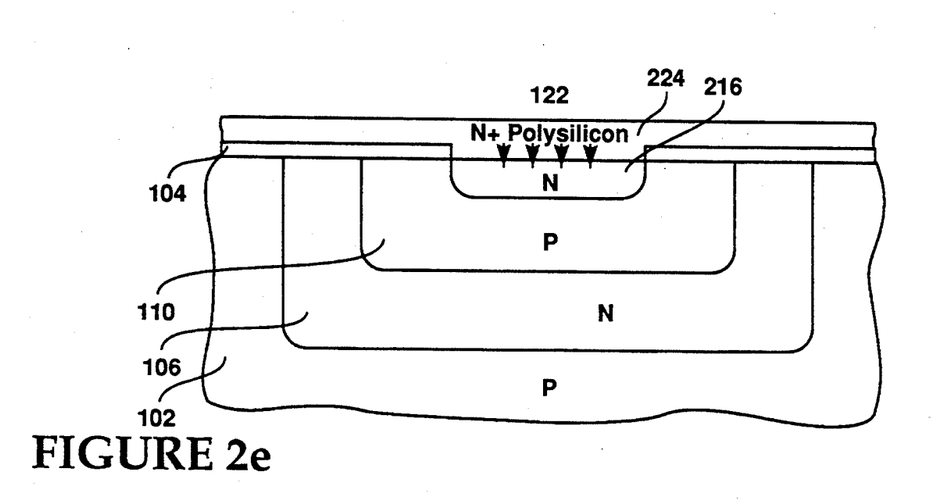
FIG. 2e illustrates the substrate of FIG. 2d during outdiffusion step.

As illustrated in FIG. 2e, the anneal step causes outdiffusion of n conductivity type dopants 122 from doped polysilicon layer 224 into the n-type substrate emitter region. The outdiffusion electrically links up doped polysilicon layer 224 with the n-type substrate emitter region. Like the process step illustrated in FIG. 1j, when phosphorus is chosen as the implant to form the emitter in the earlier step, a graded substrate emitter with a gradual concentration change results. On the other hand, when arsenic is chosen, a shallow substrate emitter results.

Figure 2F:
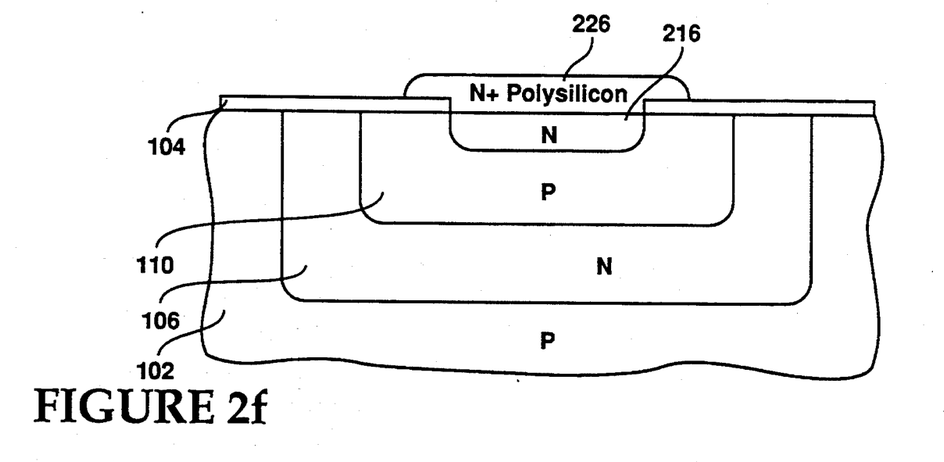
FIG. 2f illustrates substrate of FIG. 2e after the polysilicon layer is patterned and etched.

Finally, doped polysilicon layer 224 is patterned and etched to form patterned polysilicon layer 226 as shown in FIG. 2f.

Thus, a novel method of forming a high performance emitter of a bipolar transistor has been described.

What is claimed is:

1. A process of forming an emitter of a bipolar transistor in a semiconductor material, comprising the steps of:
   forming a base region having a first concentration of a first conductivity type;
   forming a first emitter region in at least a portion of said base region, said first emitter having a second concentration of a second conductivity type;
   forming a doped polysilicon layer over and in contact with said first emitter region, said polysilicon layer being formed after the formation of said first emitter region; and driving a first plurality of dopants from said polysilicon layer into said first emitter region to electrically couple said polysilicon layer and said first emitter region.

2. The process of claim 1 wherein said first emitter region is formed by implanting a second plurality of dopants into said base region.

3. The process of claim 1 wherein said first emitter region is formed by diffusing a second plurality of dopants into said base region.

4. The process of claim 1 wherein driving a first plurality of dopants from said polysilicon layer into said first emitter region comprises the step of:
   forming a second emitter region having a third concentration of a second conductivity type in said first emitter region, wherein said third concentration of said second conductivity type is greater than said second concentration of said second conductivity type.

5. The process of claim 1 further comprising the steps of:
   forming an oxide layer over said semiconductor material prior to forming said first emitter region; and
   forming an opening in said oxide layer prior to forming said first emitter region wherein said first emitter region is formed through said opening.

6. The process of claim 1 wherein said first conductivity type is p-type and said second conductivity type is n-type.

7. The process of claim 1 wherein said first conductivity type is n-type and said second conductivity type is p-type.

8. The process of claim 1 wherein forming a doped polysilicon layer and driving a first plurality of dopants from said polysilicon layer into said first emitter region comprises the step of:
   diffusing said first plurality of dopants into said polysilicon layer at a temperature between 900 and 950 degrees Celsius for a time between 10 and 30 minutes.

9. The process of claim 1 wherein driving a first plurality of dopants from said polysilicon layer into said first emitter region comprises the step of: outdiffusing said first plurality of dopants from said polysilicon layer into said first emitter region.

10. The process of claim 9 wherein outdiffusing said first plurality of dopants from said polysilicon layer into said first emitter region comprises the step of:
    exposing said polysilicon layer to a temperature between 850 and 950 degrees Celsius for a time between 10 and 30 minutes.

11. The process of claim 10 wherein forming a first emitter region in at least a portion of said base region comprises the step of:
    implanting ions in said base region using a dose of between $1.0 \times 10^{13}$ and $1.0 \times 10^{14}$ cm$^{-2}$.

12. The process of claim 1 further comprising the step of:
    forming an oxide layer over said semiconductor material prior to forming said first emitter region, wherein said first emitter region is formed through said oxide layer.

13. The process of claim 12 wherein driving a first plurality of dopants from said polysilicon layer into said first emitter region comprises the step of:
    outdiffusing said first plurality of dopants from said polysilicon layer into said first emitter region.

14. A process of making an emitter of a bipolar transistor in a semiconductor material, comprising the steps of:
   a) forming a collector region having a first concentration of a first conductivity type in a semiconductor material;
   b) forming a base region in said collector region, said base region having a second concentration of a second conductivity type;
   c) forming a first emitter region in said base region, said first emitter region having a third concentration of a first conductivity type;
   d) forming a polysilicon layer over said first emitter region, said polysilicon layer formed after the formation of said first emitter region;
   e) doping said polysilicon layer with dopants of a first conductivity type; and
   f) diffusing said dopants from said polysilicon layer into said first emitter region to electrically link said polysilicon layer to said first emitter region.

15. The process of claim 14 wherein said first emitter region is formed by implanting dopants into said base region.

16. The process of claim 14 wherein said first emitter region is formed by diffusing dopants into said base region.

17. The process of claim 14 further comprising the step of:
    forming a second emitter region having a fourth concentration of a first conductivity type in said first emitter region, wherein said fourth concentration of said first conductivity type is greater than said third concentration of said first conductivity type.

18. The process of claim 14 further comprising the steps of:
    forming an oxide layer over said semiconductor material prior to forming said first emitter region; and
    forming an opening in said oxide layer prior to forming said first emitter region wherein said first emitter region is formed through said opening.

19. The process of claim 14 further comprising the steps of:
    forming an oxide layer over said semiconductor material prior to forming said first emitter region, wherein said first emitter region is formed through said oxide layer.

20. The process of claim 14 wherein diffusing said dopants from said polysilicon layer into said first emitter region comprises the step of:
    exposing said polysilicon layer to a temperature between 850 and 950 degrees Celsius for a time between 10 and 30 minutes.

* * * * *

UNITED STATES PATENT AND TRADEMARK OFFICE
CERTIFICATE OF CORRECTION

PATENT NO. : 5,420,051
DATED : May 30, 1995
INVENTOR(S) : Bohr et al.

It is certified that error appears in the above-identified patent and that said Letters Patent is hereby corrected as shown below:

In column 2, at line 55, delete "etchted" and substitute --etched--.

In column 2, at line 67, insert --the-- between "illustrates" and "substrate".

In column 3, at line 18, delete "non transistor" and substitute --npn transistor--.

In column 7, at line 10, delete "emmittedbase" and substitute --emitter/base--.

Signed and Sealed this

Third Day of December, 1996

Attest:

BRUCE LEHMAN

Attesting Officer

Commissioner of Patents and Trademarks